United States Patent [19]

Dewey, Jr.

[11] 3,744,129

[45] July 10, 1973

[54] METHOD OF FORMING A BUS BAR

[75] Inventor: Daniel Dewey, Jr., Essex, Conn.

[73] Assignee: Rogers Corporation, Rogers, Conn.

[22] Filed: Feb. 9, 1972

[21] Appl. No.: 224,774

[52] U.S. Cl. .................... 29/624, 29/628, 174/88 R, 174/94 R, 339/17 R, 339/222, 228/56

[51] Int. Cl. .................... H02g 15/08

[58] Field of Search .................... 174/68.5, 94, 88 R; 339/17 R, 18 R, 18 B, 18 C, 19, 222, 275 R, 275 B; 29/624, 628; 228/56

[56] References Cited

UNITED STATES PATENTS 3,002,481 10/1961 Hutters .................... 174/68.5 UX

*Primary Examiner*—Darrell L. Clay
*Attorney*—David S. Fishman and Roger A. Van Kirk

[57] ABSTRACT

A bus bar is presented having a plurality of apertures therethrough with solder preforms retained in the apertures, the bus bar being particularly suited for mating with a multipin connector.

1 Claim, 11 Drawing Figures

PATENTED JUL 10 1973 3,744,129
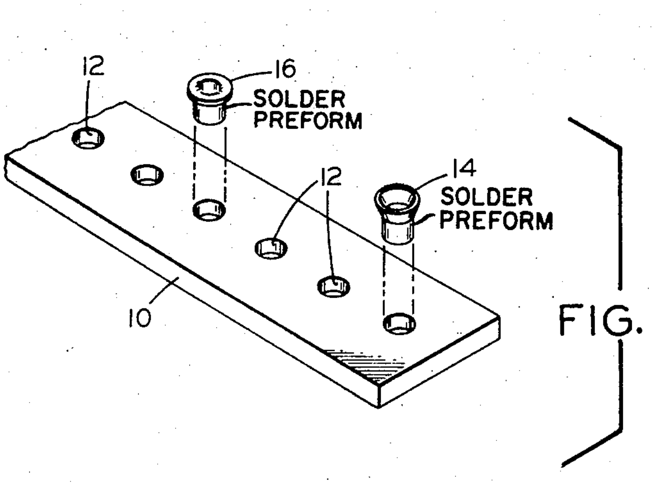
FIG. 1
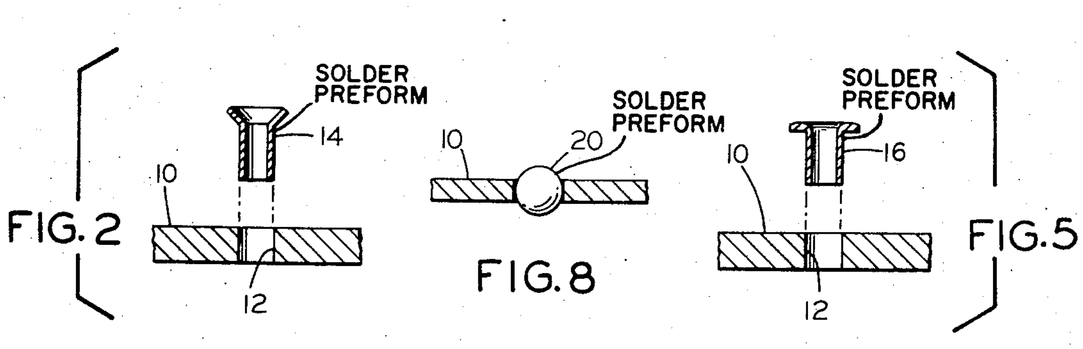
FIG. 2, FIG. 8, FIG. 5
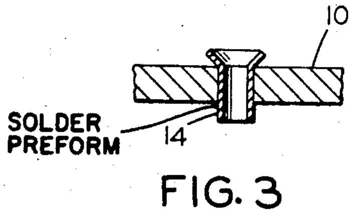
FIG. 3
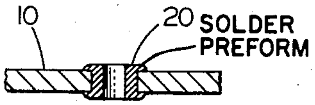
FIG. 9
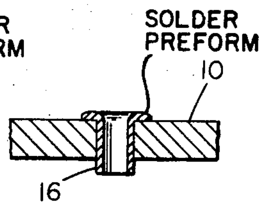
FIG. 6
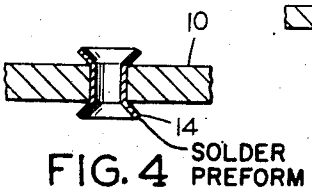
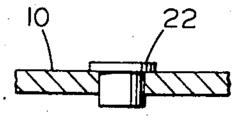
FIG. 10
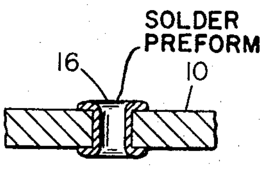
FIG. 7
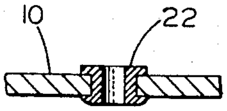
FIG. 11

METHOD OF FORMING A BUS BAR

BACKGROUND OF THE INVENTION

1. Field of the Invention

The present invention relates to interconnection techniques for electronic circuitry. More specifically, this invention is directed to the formation of solder joints for electrically connecting power and signal bus bars with electronic circuit components, particularly multipin connector elements. Accordingly, the general objects of the present invention are to provide novel and improved methods of such character and apparatus for use in the practice thereof.

2. Description of the Prior Art

While not limited thereto in its utility, the present invention has been found to be particularly well suited for use in interconnecting miniaturized bus bar assemblies to pin type connector elements, the bus bars being of the type typically formed by stamping or chemical milling techniques. Many electronic circuit components are provided with wire wrap pins and these components have previously been interconnected or connected to a power source by connecting individual conductor wires between the pins and terminals on interconnection circuitry by wrapping or clipping. Since the use of individual conductors and the requisite hand wiring thereof is a time consuming task, the expense of this joining technique is avoided whenever possible. A typical example of a situation where hand wiring may be eliminated is in the supply of power to electronic circuit components and providing a ground return for such components.

Conductors for use in the delivery of power and signals to circuit components are known in the art as bus conductors or bus bar systems. It has previously been proposed to provide bus conductors with apertures commensurate in size and shape with the cross-sectional area of the connector pins to which they are to be connected. This technique permits the bus conductors and pins to be "plugged" together. However, since the mechanical fit between the pin and the conductor portion of the bus bar can not insure a permanent electrical connection, it has still been necessary to form a solder joint between the pin and bus conductor. Such solder joints have previously been formed by first forming a ring-type solder preform and thereafter manually placing the preform on the pin in such a manner so as to rest on top of the bus bar. Thereafter, the entire circuit was passed through heating apparatus, such as an infrared head or oven, to cause the solder to melt down and form an electrical and mechanical connection between the pin and conductor. The placement of the solder preform on each pin after the bus conductors have been mated to the circuit is, in part because of the miniaturized nature of the circuitry, a highly time consuming and thus expensive task. In addition, if manual steps must be performed, there is an inherent residual possibility that the solder preforms will not be placed on one or more of the pins thus resulting in the entire circuit being defective.

SUMMARY OF THE INVENTION

The present invention overcomes the above briefly discussed and other deficiencies of the prior art by providing a novel and improved apparatus and technique for use in the joining of pintype conductors, especially those on multipin connector elements, to bus bar conductors oriented substantially transverse thereto. The present invention also provides a novel bus conductor configuration particularly well suited for use in the novel technique of the present invention.

In accordance with the invention eyelets are formed from solder and are mechanically secured in the apertures in a bus conductor prior to mating of the conductor with a multipin connector or other electronic circuit. In practice, solder preforms which are preferably headed or flared on one end are formed and are mechanically deposited in the preformed holes in the bus conductor. Thereafter, the solder "eyelets" are flared or upset at their opposite ends so as to mechanically hold the solder in place. After the bus conductors with the solder "eyelets" have been mated to the pins of the multipin connector, solder joints between the pins and bus conductor are formed by conventional prior art heating techniques.

BRIEF DESCRIPTION OF THE DRAWING

The present invention may be better understood and its numerous advantages will become apparent to those skilled in the art by reference to the accompanying drawing wherein like reference numerals refer to like elements in the several figures and in which:

FIG. 1 is a perspective exploded view of a bus bar in accordance with the present invention at an intermediate stage of manufacture;

FIGS. 2, 3 and 4 respectively depict serially performed assembly operations for a bus conductor in accordance with a preferred embodiment of the present invention; and FIGS. 5, 6 and 7 depict assembly operations for a second embodiment of the present invention.

FIGS. 8, 9, 10 and 11 depict assembly operations for other embodiments of the invention.

DESCRIPTION OF THE PREFERRED EMBODIMENTS

A strip-type bus conductor of the type which may be employed with the present invention is indicated at 10 in the drawing. Bus conductor 10 is a single layer, uninsulated conductor having a plurality of apertures 12 formed therein. However, it may be noted that conductor 10 might be provided with insulation on one or both sides or could be a multilayer type conductor. It may also be noted that the apertures 12 in conductor 10 need not be arranged in linear fashion as shown, and could be of square or other shape as well as circular.

In accordance with the invention solder preform "eyelets" are formed from a flat strip of solder by means of conventional eyeletting apparatus. The "eyelets" may be of either the flared type 14 depicted in FIGS. 1–4 or the rolled type as depicted at 16 in FIGS. 1 and 5–7. The outer size and shape of the solder preform "eyelets" are commensurate with the dimensions of the apertures 12 in conductor 10 whereby the "eyelets" may be inserted, as shown in FIGS. 3 and 6, in the apertures with the flared or rolled over portions preventing the eyelets from passing completely through the apertures 12. After insertion, the "eyelets" are headed or flared on their opposite ends, as depicted in FIGS. 4 and 7, whereby the solder preforms are mechanically retained in place in the apertures.

After completion of the steps shown in FIGS. 4 and 7, the bus conductors are ready for use and may be positioned on electronic connector components having wire pins extending outwardly therefrom. With the bus conductors installed, the connector pins will extend through the "eyelets" 14 or 16. After installation the solder is fused by one of several conventional heating techniques whereby reliable gas-tight electrical connections will be established between conductor 10 and the pins.

The present invention has been proven to be a substantial improvement over the prior art for a number of reasons. First, the element of human error has been virtually eliminated since the bus conductors may be easily manipulated, without manipulation of an entire electronic subassembly, and thus manually or automatically checked to determine whether each of the apertures 12 which should have a solder preform is provided with an "eyelet"; there being cases where only selected apertures will be provided with "eyelets". Also, since it is not necessary to manipulate the entire electronic circuit when placing the solder preforms on the bus conductor, the "eyelets" may be assembled to the bus conductor mechanically thereby eliminating the previous time consuming manual operation of placing a solder "ring" over each pin.

It should also be noted that the "eyelet" preform may also be in the form of a hollow cylinder or tube with straight, i.e. non-flared, ends. The ends would be upset by heading or flaring as described above after insertion in the bus, a light friction fit being sufficient to hold the preform in the bus aperture until the ends are upset.

The solder preforms discussed above have all been in an "eyelet" configuration, i.e. have an aperture therethrough prior to insertion in the bus conductor. Alternatively, the preforms could be in the form of a solid ball of solder 20 inserted into the aperture 12 prior to piercing, as shown in FIG. 8, and retained therein by friction or press fit. Thereafter, as shown in FIG. 9, the ball preform 20 is flattened to provide upset rolled portions engaging the upper and lower surfaces of conductor 10, and also pierced to provide its control aperture to accommodate a wire pin connector.

FIGS. 10 and 11 show still another alternative embodiment wherein the preform is in the form of a solid solder plug 22 of circular cross section and having an enlarged head. Plug 22 is inserted into the aperture 12 of bus conductor 10 whereby the enlarged head engages the upper surface of conductor 10 to hold the plug, as shown in FIG. 10. Thereafter, as shown in FIG. 11, the reduced diameter portion of the plug is upset as by rolling at its end to engage the bottom surface of conductor 10, and a central aperture is pierced in the plug to accommodate a wire pin connector.

As with the embodiments discussed in FIGS. 2–7, ultimate connection of the preforms of FIGS. 8–11 to pin conductors is achieved by insertion of the conductors into the preform apertures and then fusing the preforms to the pins and the bus conductor 10.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of forming a bus bar including the steps of:

forming a plurality of apertures in a bus bar;

inserting solid solder preforms in at least some of said apertures;

upsetting at least one end of each of said preforms to define a portion thereof which serves to retain said preforms in said apertures; and piercing said preforms subsequent to the upsetting of at least one end thereof.

* * * * *